United States Patent
Zaderej et al.

(10) Patent No.: US 6,692,310 B2
(45) Date of Patent: Feb. 17, 2004

(54) MODULAR SYSTEM FOR STACKING ELECTRICAL CONNECTOR ASSEMBLIES

(75) Inventors: Victor V. Zaderej, St. Charles, IL (US); Gregory R. LaMirand, Geneva, IL (US); Eric C. Smith, St. Charles, IL (US)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 09/999,357

(22) Filed: Nov. 1, 2001

(65) Prior Publication Data

US 2003/0082955 A1 May 1, 2003

(51) Int. Cl.[7] .......................................... H01R 13/502
(52) U.S. Cl. ...................... 439/701; 439/65; 439/76.1; 439/567; 439/541.5
(58) Field of Search ............................. 439/701, 76.1, 439/65, 74, 567, 66, 541.5

(56) References Cited

U.S. PATENT DOCUMENTS

| | | | |
|---|---|---|---|
| 4,973,262 A | * 11/1990 | Gerke et al. | 439/395 |
| 5,057,971 A | 10/1991 | Hautvast et al. | 361/395 |
| 5,226,823 A | * 7/1993 | Johnson | 439/66 |
| 5,536,177 A | * 7/1996 | Casey | 439/74 |
| 5,788,347 A | * 8/1998 | Rabinovitz | 312/111 |
| 5,963,432 A | * 10/1999 | Crowley | 361/804 |
| 6,038,130 A | 3/2000 | Boeck et al. | 361/735 |
| 6,201,698 B1 | 3/2001 | Hunter | 361/704 |
| 6,276,963 B1 | 8/2001 | Avery et al. | 439/541.5 |

* cited by examiner

*Primary Examiner*—Truc Nguyen
(74) *Attorney, Agent, or Firm*—Stacey E. Caldwell

(57) ABSTRACT

A modular system is provided for arranging a plurality of electrical connector assemblies in a stacked array. The system includes at least a pair of electrical connector assemblies stackable one on top of another. Each assembly includes a frame structure having input and output faces, with an interior cavity between the faces. Input and output connectors are respectively mounted at the input and output end faces and project outwardly therefrom. A circuit board is located in the interior cavity and is electrically connected between the input and output connectors. A pair of end flanges project outwardly from at least one of the input and output end faces above and below the respective input or output connector to protect the respective connector. The end flanges have fastening portions to facilitate holding the frame structures and, thereby, the electrical connector assemblies in the stacked array. Electrical connectors also are coupled between the circuit boards of the stacked connector assemblies through the frame structures thereof.

25 Claims, 5 Drawing Sheets

MODULAR SYSTEM FOR STACKING ELECTRICAL CONNECTOR ASSEMBLIES

FIELD OF THE INVENTION

This invention generally relates to the art of electrical connectors and, particularly, to a modular system for arranging a plurality of electrical connector assemblies in a stacked array.

BACKGROUND OF THE INVENTION

Electrical connectors are used in a wide variety of applications ranging from simple connecting interfaces between hard conductor wiring to more sophisticated applications involving such components as printed circuit boards, flat flexible cables and optical fibers. Basically, electrical connectors include some form of contacts, terminals or other conductors which interconnect one electrical device to another electrical device. As used herein, the terms "electrical" or "electrical connectors" or the like are intended to include optical devices.

In some environments, it is desirable to stack electrical connector assemblies with one connector assembly on top of another connector assembly. One such environment is in the data processing system of a computer wherein different connectors perform different information and regulating tasks. There are other environments wherein stackable electrical connectors would be desirable, but most systems for stacking connector assemblies are complicated and not user friendly.

For instance, a modular system for stacking electrical connector assemblies would be desirable and very useful in the automotive or vehicular industry for interconnecting various consumer electronic products. There currently are numerous products which are used within vehicles, such as GPS systems, cellular telephones, MP3 players, CD players, wireless devices and the like. Some of these devices may be installed by automobile manufacturers, but most of the devices typically are installed subsequently in service workshops or the like. It would be desirable to provide a modular system for stacking a plurality of electrical connectors substantially at will, so that the system can be customized or tailored to the customers' desires or requirements.

In addition, such a system in automobile environments must not only provide connector interconnections, but the connectors, themselves, must be protected; the connectors oftentimes must be electrically shielded from EMI and/or RFI interference; the connectors must be easily stackable for addition purposes in the after market; and there may be instances where the stacked connector assemblies, themselves, may be electrically interconnected to communicate between each other. It could be difficult to provide all of these features or requirements in a single modular system. However, the invention herein has done just that in a remarkably simple, cost effective and user friendly modular system.

SUMMARY OF THE INVENTION

An object, therefore, of the invention is to provide a new and improved modular system for arranging a plurality of electrical connector assemblies in a stacked array with one connector assembly stacked on top of another connector assembly.

In the exemplary embodiment of the invention, at least a pair of electrical connector assemblies are stackable one on top of another. Each assembly includes a frame structure having an input end face and an output end face with an interior cavity between the end faces. An input connector is mounted at the input end face and projects outwardly therefrom. An output connector is mounted at the output end face and projects outwardly therefrom. A circuit board is disposed in the interior cavity and is electrically connected between the input and output connectors. A pair of end flanges project outwardly from at least one of the input or output end faces above and below the respective input or output connector to protect the respective connector. The flanges have fastening means to facilitate holding the frame structures and, thereby, the electrical connector assemblies in the stacked array. As disclosed herein, a pair of the end flanges project outwardly from each of the input and output end faces above and below each input and output connector. In essence, the end flanges perform a dual function of protecting the projecting connectors as well as providing the fastening means to stack the frame structures.

According to one aspect of the invention, at least portions of the end flanges are of metallic material to perform a third function of an electrical shielding means for the respective input or output connectors. As disclosed herein, the end flanges are fabricated of metal plated plastic material and, preferably, substantially the entirety of the frame structures are fabricated of the metal plated plastic material.

According to another aspect of the invention, the frame structure of each of the connector assemblies comprises a two-part structure including a base housing part which forms the interior cavity and one of the pair of end flanges. A cover part closes the cavity and defines the other of the pair of end flanges.

According to a further aspect of the invention, at least one fastener is operatively associated with the fastening means of the end flanges to hold the frame structures and, thereby, the electrical connector assemblies in the stacked array. In the exemplary embodiment, the fastening means comprise holes in the end flanges, and a fastener is preassembled in the hole in the end flange of one of the stackable frame structures. Therefore, one electrical connector can be grasped by a user and easily manipulated and held in place while using his or her other hand to operate the preassembled fastener. As disclosed herein, the preassembled fastener comprises a snap-latch expandable rivet.

Finally, a feature of the invention is the provision of electrical connection means coupled between the circuit boards of the stacked connector assemblies through the frame structures of the assemblies. As disclosed herein, the frame structure of each connector assembly includes a top wall and a bottom wall. The electrical connection means comprises a top connector coupled to a top side of the respective circuit board and exposed through the top wall of a bottom connector assembly. A bottom mating connector is coupled to a bottom side of the respective circuit board and is exposed through the bottom wall of a top connector assembly.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
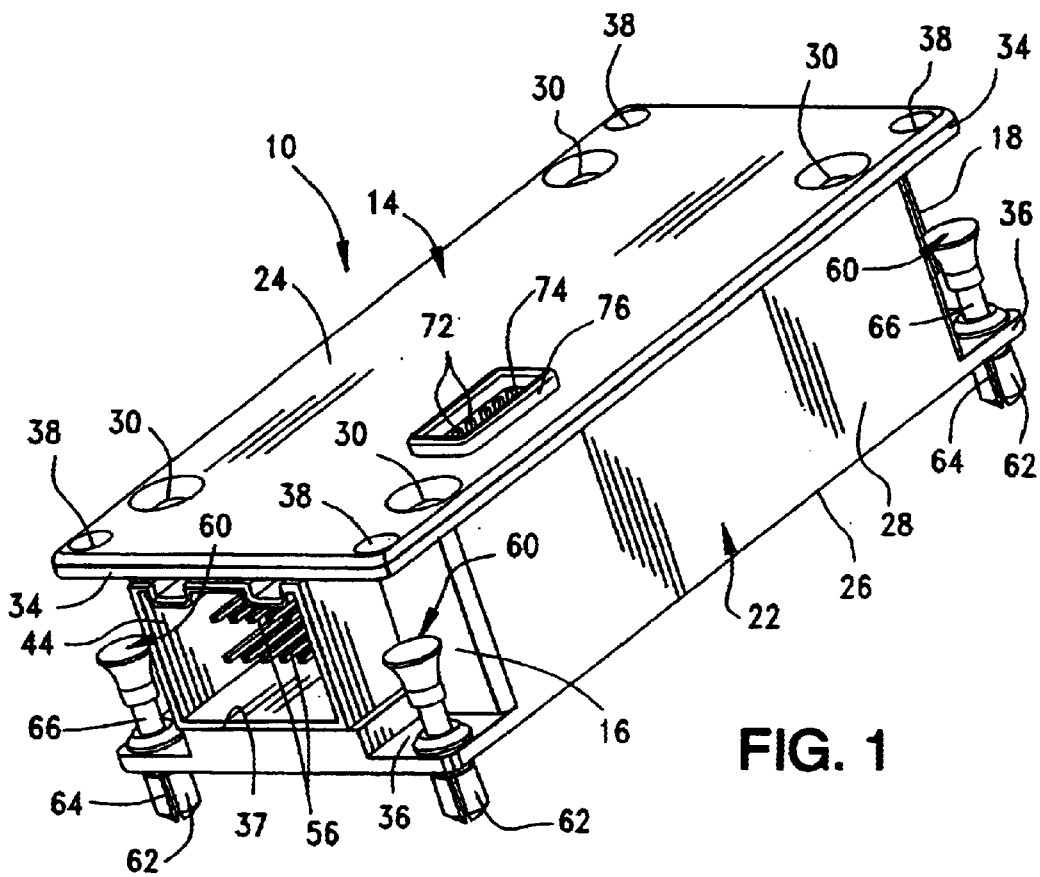
FIG. 1 is a top perspective view of one of the modular electrical connector assemblies according to the invention.
Figure 2:
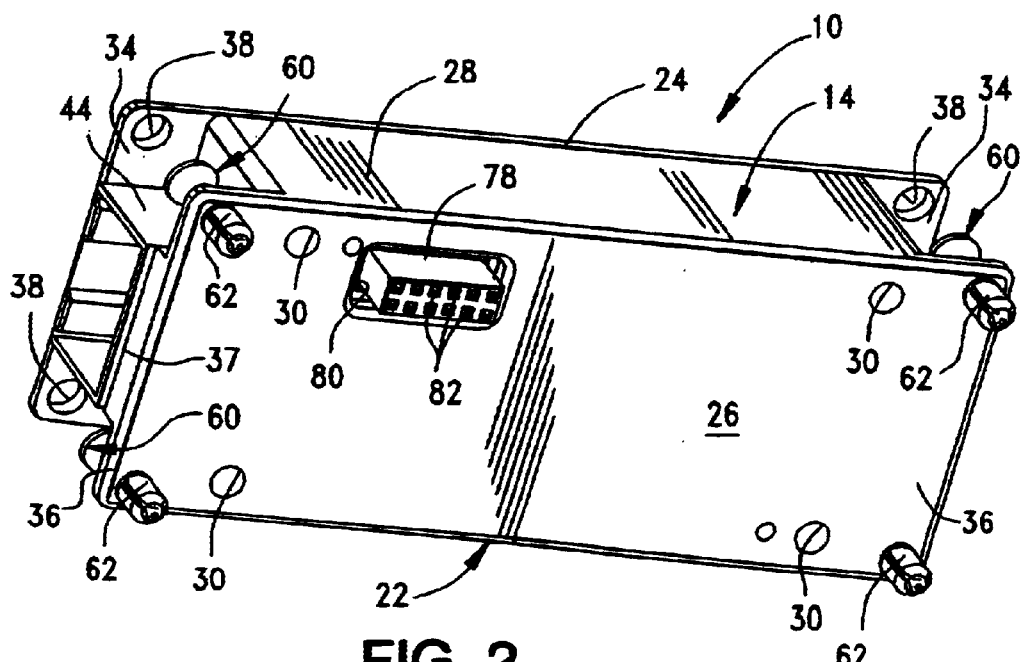
FIG. 2 is a bottom perspective view of one of the modular electrical connector assemblies.
Figure 3:
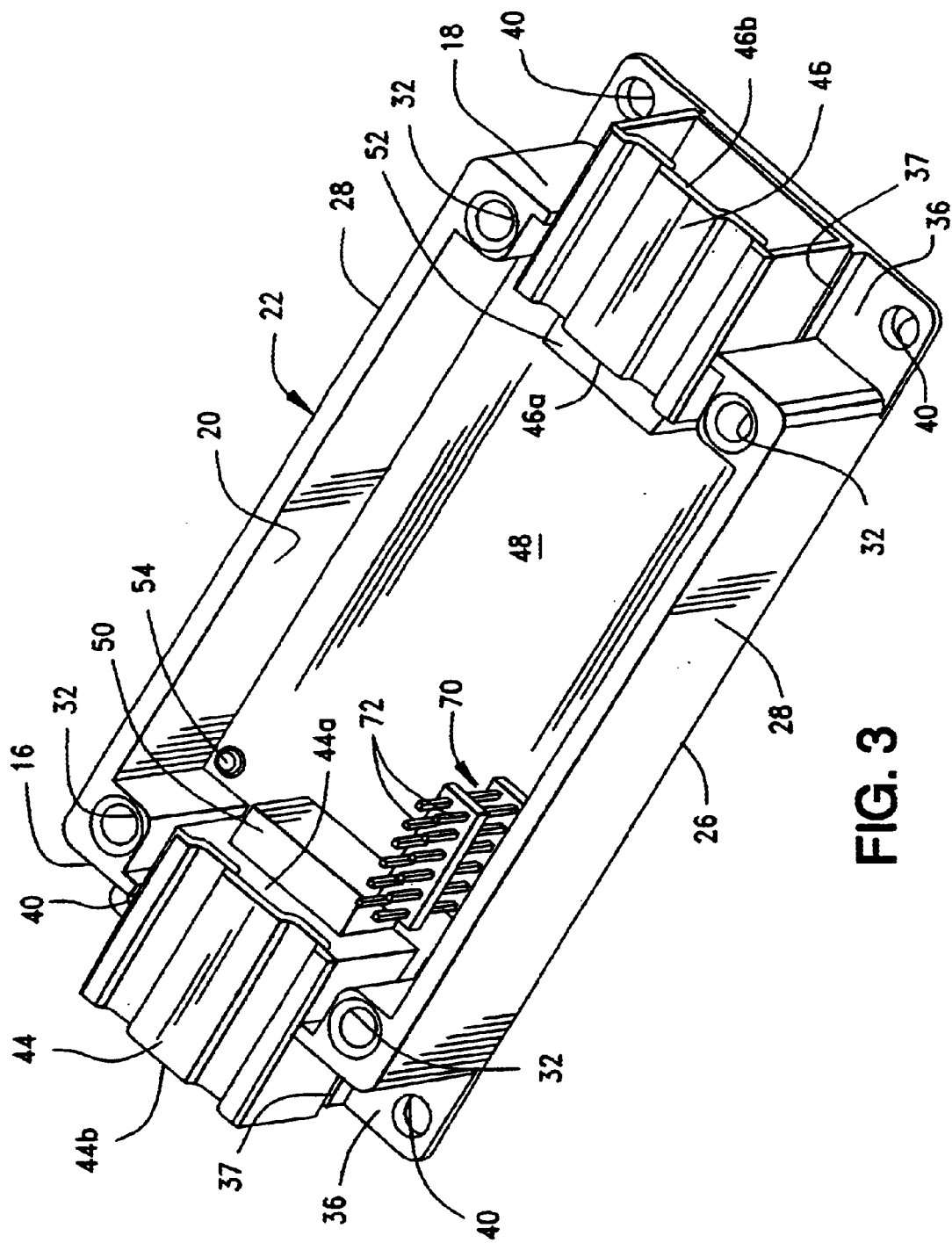
FIG. 3 is a top perspective view of one of the assemblies, with the top cover and the fasteners removed to facilitate the illustration.

Referring to the drawings in greater detail, and first to FIGS. 1–3, the invention is embodied in a modular system for arranging a plurality of electrical connector assemblies, generally designated 10, in a stacked array with one connector assembly stacked on top of another connector assembly. At this point, it should be understood that the use of such words as "top", "bottom" and the like are used herein and in the claims hereof to provide a clear and concise understanding of the invention as the connector assemblies are viewed in the drawings. It should be understood that these terms are for reference purposes only, because the modular system of the invention is omni-directional in use and function.

With that understanding, each electrical connector assembly 10 includes a two-part, box-shaped frame structure, generally designated 14, defining an input end face 16 and an output end face 18, with an interior cavity 20 (FIG. 3) extending between the end faces. The two-part frame structure includes a bottom base housing part, generally designated 22, and a top cover part 24. The base housing part has a bottom wall 26 and a pair of side walls 28 which combine with end faces 16 and 18, to form interior cavity 20. Top cover part 24 generally is a flat or planar, rectangular component which forms a top wall for the interior cavity. The top cover part can be secured to the base housing part by four fasteners, such as screws or the like (not shown), inserted through four holes 30 in the cover part and threaded into four internally threaded holes 32 (FIG. 3) in the base housing part.

According to the invention, a pair of end flanges of box-shaped frame structure 14 project outwardly from each of the input and output end faces 16 and 18, respectively. In particular, each pair of end flanges includes a top end flange 34 and a bottom end flange 36. The top end flange is simply formed by a continuation of the opposite ends of planar cover part 24 of the frame structure. Bottom end flanges 36 are formed by extensions of bottom wall 26 of the base housing part of the frame structure but include raised connector support platforms 37 outside the end faces to support the connectors described hereinafter. The end flanges have fastening means in the form of a pair of fastening holes 38 (FIGS. 1 and 2) in top end flanges 34 at the corners thereof, and a pair of fastening holes 40 (FIG. 3) in each bottom end flange 36 at the corners thereof. When a pair of connector assemblies are stacked, as described hereinafter, holes 40 in bottom end flanges 36 of a top connector assembly align with holes 38 in the top flanges of a bottom connector assembly.

As will be seen hereinafter, end flanges 34 and 36 of frame structure 14 perform multiple functions. One of those functions is to provide an electronic shield against EMI and RFI interference with the connectors (described hereinafter) of the modular connector assembly. To that end, at least the end flanges are fabricated of metal coated or plated plastic material. Preferably, substantially the entirety of both the bottom base housing part 22 and the top cover part 24 of frame structure 14 are fabricated of metal plated plastic material, such as molding the parts and then plating the parts with the shielding metal material.

As best seen in FIG. 3, an input connector 44 is mounted through input end face 16 of frame structure 14 and projects outwardly from the input end face. In other words, an inner end 44a of input connector 44 is disposed within interior cavity 20, while an outer end 44b projects exteriorly beyond input end face 16. Similarly, an output connector 46 is mounted through output end face 18 of frame structure 14 and projects outwardly therefrom. Again, an inner end 46a of the output connector is disposed within cavity 20 and an outer end 46b projects beyond output end face 18. A circuit board 48 is disposed within cavity 20 and is electrically connected, as at 50 and 52, to the respective input and output connectors 44 and 46. The circuit board may be staked, as at 54 (FIG. 3), to bottom wall 26 of base housing part 22. As seen in FIG. 1, each input and output connector 44 and 46, respectively, includes a plurality of terminals, such as terminal pins 56, which engage female terminals or contacts of complementary mating connectors (not shown) inserted into the input and output connectors. The terminal pins are electrically connected to appropriate circuit traces on circuit board 48, as at 50 and 52 (FIG. 3).

Figure 4:
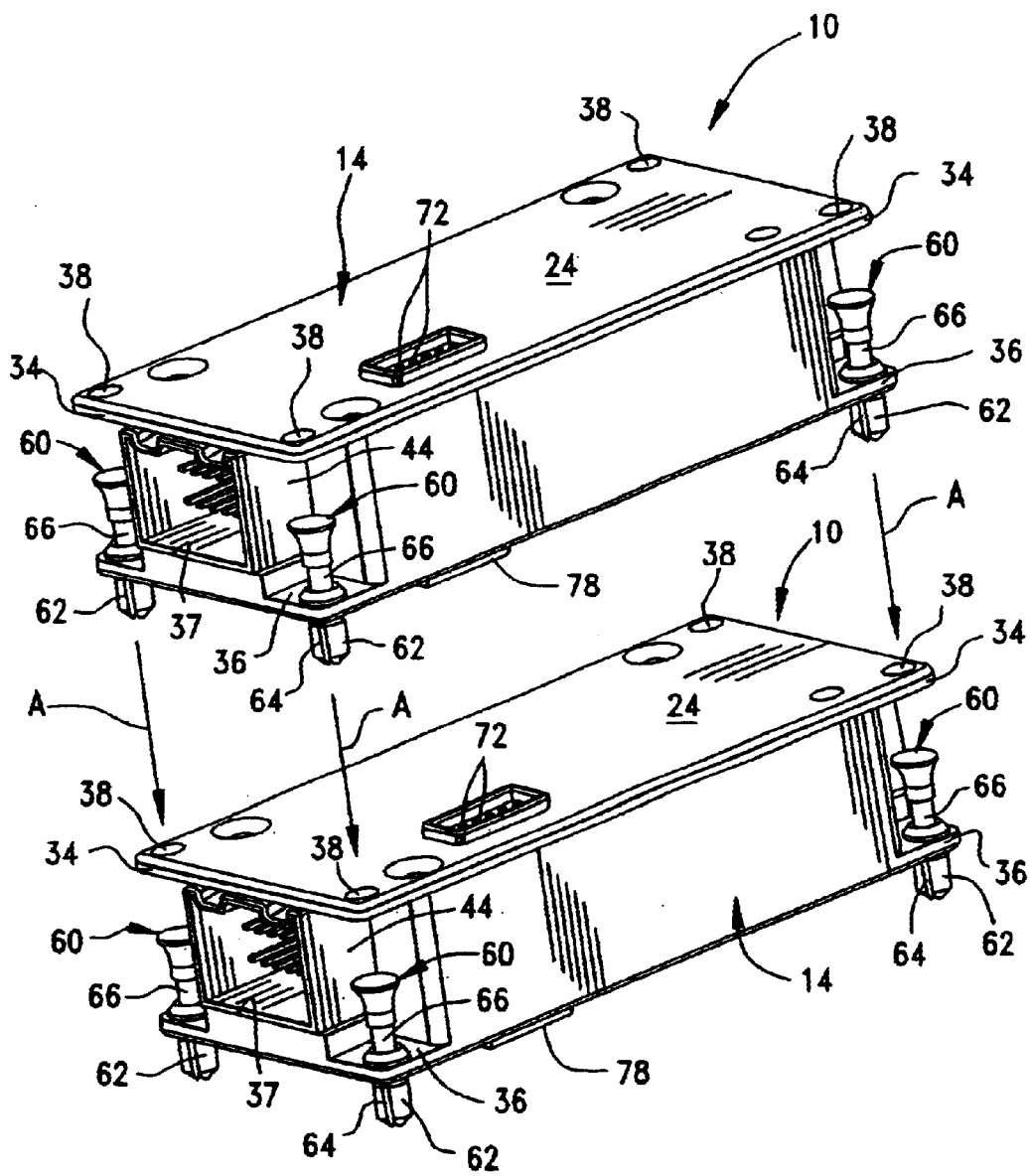
FIG. 4 is a perspective view of a pair of the assemblies about to be stacked.
Figure 5:
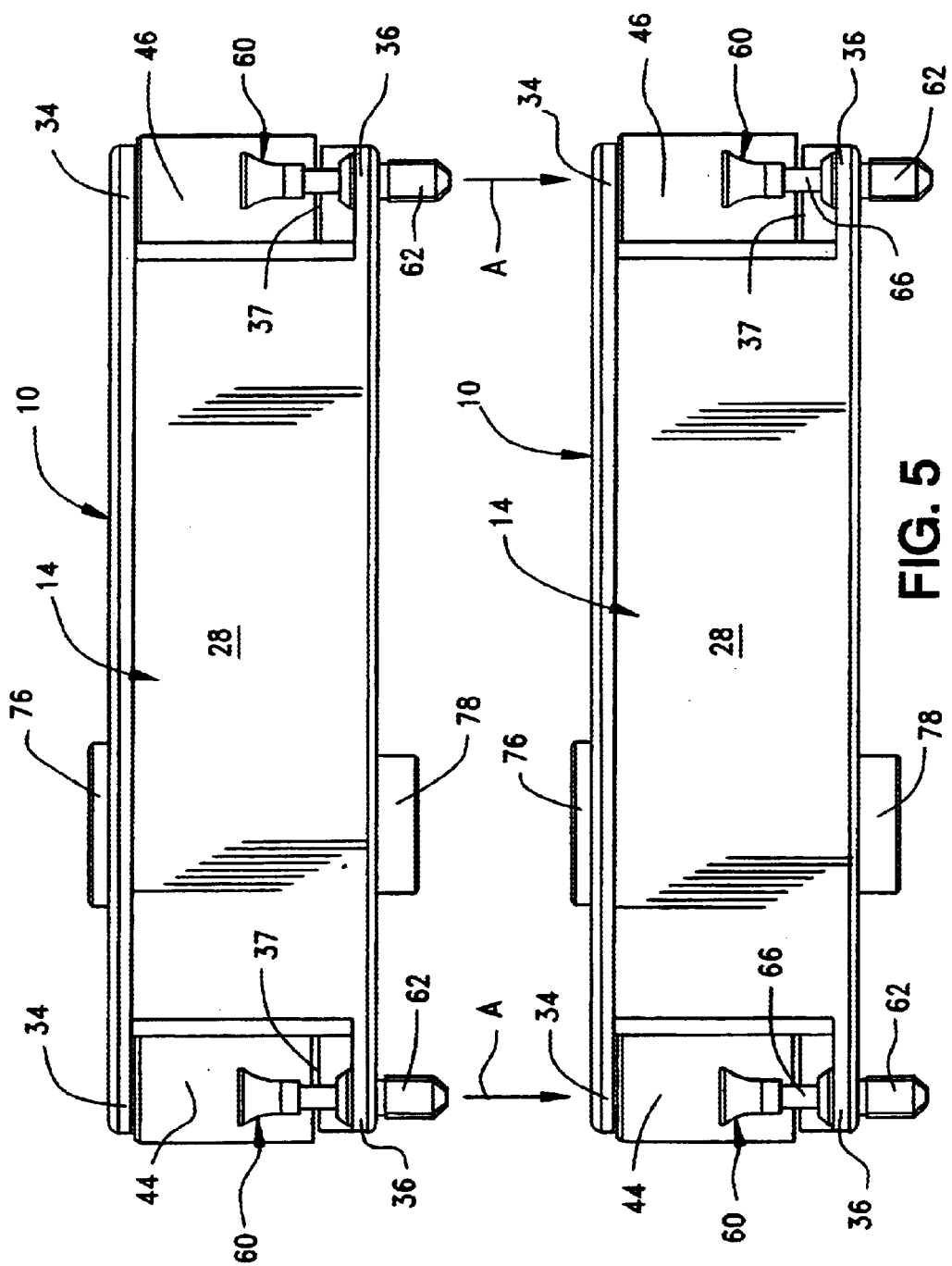
FIG. 5 is a side elevational view of a pair of the assemblies about to be stacked.
Figure 6:
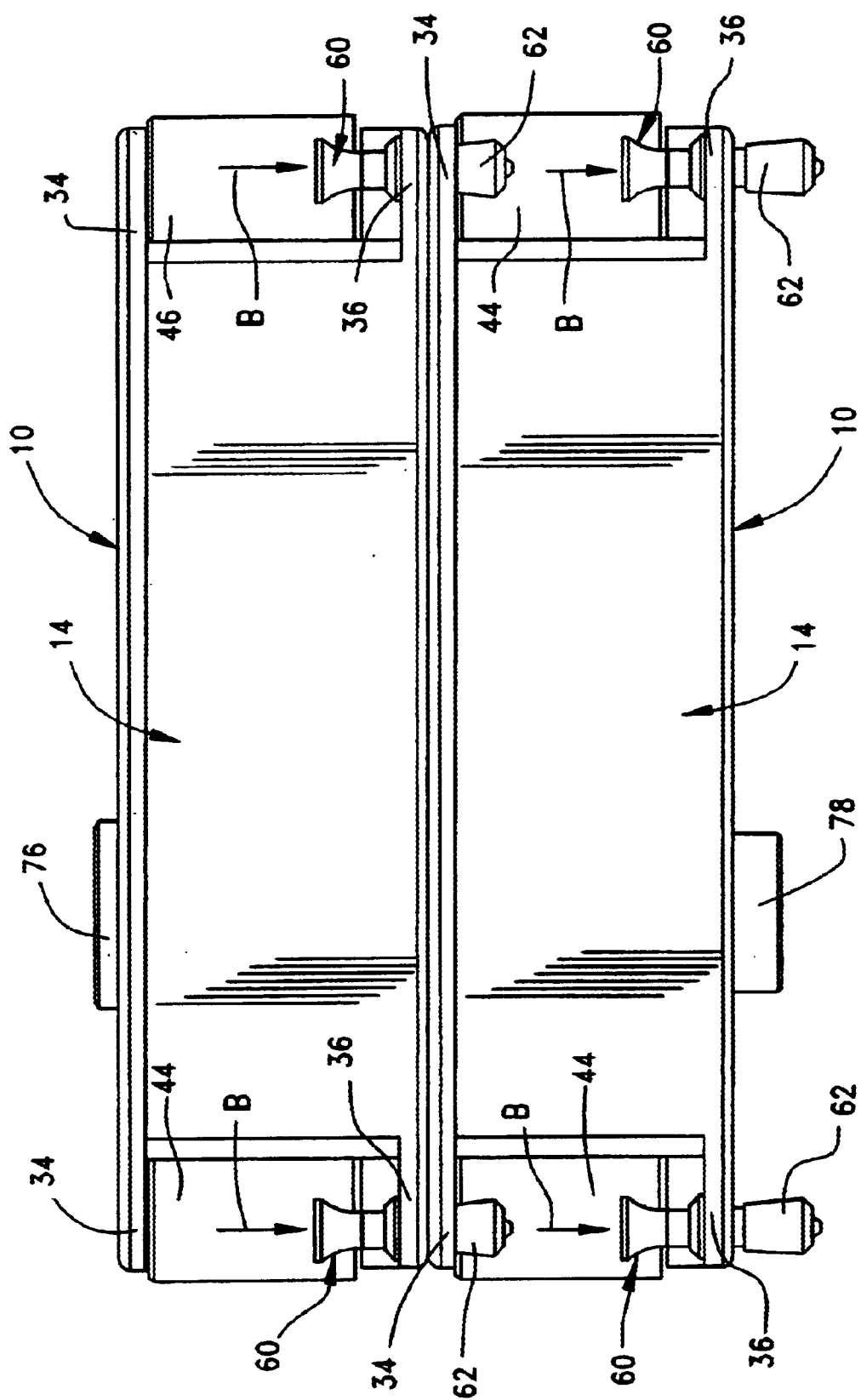
FIG. 6 is a side elevational view of a pair of the assemblies in a stacked array.

FIGS. 4 and 5 show a pair of modular connector assemblies 10 about to be stacked in the direction of arrows "A", and FIG. 6 shows the two modular connector assemblies in a fully stacked array. In stacking, one box-shaped frame structure 14 of a top connector assembly simply is stacked on top of the box-shaped frame structure of a bottom connector assembly to align the fastening means in the form of holes 38 and 40 in the top and bottom end flanges 34 and 36, respectively, of the respective stacked frame structures. In order to hold the connector assemblies in such a stacked array, a plurality of fasteners, generally designated 60, are operatively associated with holes 40 in bottom end flanges 36.

More particularly, each fastener 60 is of a type which is considered a snap-latch expandable rivet. Each expandable rivet is a two-part component which includes an expandable base 62 which is generally cylindrical and is snap-fit into a respective one of the fastening holes 40. The base is vertically slit, as at 64 (FIG. 4), so that the base can expand laterally. A vertically reciprocal post 66 is disposed within the expandable base. The post has an enlarged head (not visible in the drawings) at the bottom thereof which is insertable into expandable base 62. FIGS. 4 and 5 show posts 66 elevated relative to expandable bases 62, whereby the bases are contracted. When a top connector assembly 10 is stacked on top of a bottom connector assembly, posts 66 are elevated and expandable bases 62 are contracted so that the bases can be inserted into fastening holes 38 in top flanges 34 of the bottom connector assembly. When the connector assemblies are properly stacked as shown in FIG. 6, posts 66 are pushed downwardly in the direction of arrows "B", whereupon bases 62 expand to lock the expandable rivets into place and to hold the connector assemblies in their stacked array. As seen in FIGS. 4–6, expandable rivets 60 also are provided in the bottom connector assembly so that the bottom connector assembly can be secured to an extraneous support structure (not shown) or even on top of an exterior printed circuit board or "mother board". Otherwise, the expandable rivets in the bottom connector assembly might be omitted.

Finally, a feature of the invention, generally, is the provision of electrical connection means coupled between circuit boards 48 of at least a pair of stacked connector assemblies 10 through frame structures 14 of the connector assemblies. More particularly, FIG. 3 shows a pin connector, generally designated 70, which includes a plurality of terminal pins 72. The bottom ends of the terminal pins are inserted into appropriate holes in circuit board 48 for electrical connection to circuit traces on the board and/or in the holes. As seen in FIG. 1, the top ends of terminal pins 72 are exposed within an opening 74 in top cover 24. The opening is surrounded by a protective guiding shroud portion 76 which may be formed integrally with the cover.

FIG. 2 shows a plug connector 78 extending through an opening 80 in bottom wall 26 of base housing part 22 of frame structure 14. Plug connector 78 is insertable into opening 74 (FIG. 1) when the connector assemblies are stacked, and female terminals or contacts 82 (FIG. 2) interengage with the tops of terminal pins 72. Female terminals 82 are connected to circuit traces on the interior circuit board or, alternatively, terminal pins 72 can extend all the way through the circuit board so that the pins are "communed" through successively stacked circuit boards by the medium of plug connector 78 and female terminals 82. In other words, in a stacked array of multiple connector assemblies, connectors 78 would perform a joining or splicing function between the terminal pins 72 within the stacked array of connector assemblies. Of course, other electrical connector arrangements are contemplated for providing electrical connection means coupling the circuit boards 48 of a plurality of stacked connector assemblies 10 through the respective frame structures 14 of the connector assemblies.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A moaular system for arranging a plurality of electrical connector assemblies in a stacked array with one connector assembly on top of another connector assembly, comprising:
   at least a pair of electrical connector assemblies stackable one on top of another in a stacking direction and each including
      a frame structure having an input end face and an output end face with an interior cavity between the end faces,
      an input connector mounted at the input end face of the frame structure and projecting outwardly therefrom,
      an output connector mounted at the output end face of the frame structure and projecting outwardly therefrom,
      a circuit board in the interior cavity of the frame structure and electrically connected between the input and output connectors, and
   a pair of end flanges projecting outwardly from at least one of the input and output end faces above and below the respective input or output connector, the flanges extending along at least a portion of the respective input or output connector in a direction generally perpendicular to the stacking direction to protect the respective connector, the end flanges having fastening means to facilitate holding the frame structures and, thereby, the electrical connector assemblies in the stacked array.

2. The modular system of claim 1, including a pair of said end flanges projecting outwardly from each of the input and output end faces above and below each input and output connector.

3. The modular system of claim 1 wherein at least portions of said end flanges are of metallic material to provide an electrical shielding means for the respective input or output connector.

4. The modular system of claim 1 wherein the frame structure of at least one of said connector assemblies comprises a base housing part defining said interior cavity and one of said pair of end flanges, and a cover part for closing the cavity and defining the other of said pair of end flanges.

5. The modular system of claim 1 wherein said frame structure is a two-part structure with each part defining one of said pair of end flanges.

6. The modular system of claim 1, including at least one fastener operatively associated with said fastening means to hold the frame structures and, thereby, the electrical connector assemblies in the stacked array.

7. The modular system of claim 1, including electrical connection means coupled between the circuit boards of the stacked connector assemblies through the frame structures of the connector assemblies.

8. The modular system of claim 3 wherein said end flanges are fabricated of metal plated plastic material.

9. The modular system of claim 8 wherein substantially the entirety of said frame structures is fabricated of metal plated plastic material.

10. The modular system of claim 6 wherein said fastening means comprise aligned holes in the end flanges and said at least one fastener is preassembled in the hole in the end flange of one of the stackable frame structures.

11. The modular system of claim 10 wherein said at least one fastener comprises a snap-latch expandable rivet.

12. The modular system of claim 7 wherein the frame structure of each connector assembly includes a top wall and a bottom wall, and said electrical connection means comprises a top connector coupled to a top side of the circuit board and exposed through the top wall of a bottom connector assembly and a bottom mating connector coupled to a bottom side of the circuit board and exposed through the bottom wall of a top connector assembly.

13. A modular system for arranging a plurality of electrical connector assemblies in a stacked array with one connector assembly on top of another connector assembly, comprising:
   at least a pair of electrical connector assemblies stackable one on top of another in a stacking direction and each including
      a frame structure having an interior cavity and an end face,
      a connector mounted at said end face and projecting outwardly therefrom, and
      a pair of end flanges projecting outwardly from said end face above and below the connector, the flanges extending along at least a portion of the connector in a direction generally perpendicular to the stacking direction to protect the connector, the end flanges having fastening means to facilitate holding the frame structures and, thereby, the electrical connector assemblies in the stacked array.

14. The modular system of claim 13 wherein at least portions of said end flanges are of metallic material to provide an electrical shielding means for the respective input or output connector.

15. The modular system of claim 13 wherein the frame structure of at least one of said connector assemblies comprises a base housing part defining said interior cavity and one of said pair of end flanges, and a cover part for closing the cavity and defining the other of said pair of end flanges.

16. The modular system of claim 13 wherein said frame structure is a two-part structure with each part defining one of said pair of end flanges.

17. The modular system of claim 13, including at least one fastener operatively associated with said fastening means to hold the frame structures and, thereby, the electrical connector assemblies in the stacked array.

18. The modular system of claim 13 wherein a bottom one of said pair of end flanges includes a support portion on top of which the connector rests.

19. The modular system of claim 14 wherein said end flanges are fabricated of metal plated plastic material.

20. The modular system of claim 19 wherein substantially the entirety of said frame structures is fabricated of metal plated plastic material.

21. The modular system of claim 17 wherein said fastening means comprise aligned holes in the end flanges and said at least one fastener is preassembled in the hole in the end flange of one of the stackable frame structures.

22. A modular system for arranging a plurality of electrical connector assemblies in a stacked array with one connector assembly on top of another connector assembly, comprising:
   at least a pair of electrical connector assemblies stackable one on top of another in a stacking direction and each including
      a frame structure having an input end face and an output end face facing in a mating direction generally perpendicular to said stacking direction with an interior cavity between the end faces,
      an input connector mounted at the input end face of the frame structure and projecting outwardly therefrom in said mating direction,
      an output connector mounted at the output end face of the frame structure and projecting outwardly therefrom in said mating direction,
      a circuit board in the interior cavity of the frame structure and electrically connected between the input and output connectors, and
      electrical connection means coupled between the circuit boards of the stacked connector assemblies extending within the interior cavities of the frame structures in said stacking direction of the connector assemblies.

23. The modular system of claim 22 wherein the frame structure of each connector assembly includes a top wall and a bottom wall, and said electrical connection means comprises a top connector coupled to a top side of the circuit board and exposed through the top wall of a bottom connector assembly and a bottom mating connector coupled to a bottom side of the circuit board and exposed through the bottom wall of a top connector assembly.

24. A modular system for arranging a plurality of electrical connector assemblies in a stacked array with one connector assembly on top of another connector assembly, comprising:
   at least a pair of electrical connector assemblies stackable one on top of another in a stacking direction and each including
      a frame structure having two ends with an interior cavity between the ends,
      a first connector mounted at one end of the frame structure and projecting outwardly therefrom,
      a second connector mounted at one end of the frame structure and projecting outwardly therefrom,
      a circuit board in the interior cavity of the frame structure and electrically connected between the first and second connectors, and
   a pair of end flanges projecting outwardly from at least one of the ends above and below a respective one of the first or second connectors, the flanges extending along at least a portion of the respective one of the connectors in a direction generally perpendicular to the stacking direction to protect the connector, the end flanges having fastening means to facilitate holding the frame structures and, thereby, the electrical connector assemblies in the stacked array.

25. The modular system of claim 24 wherein the first connector and the second connector are mounted at the same end of the frame structure.

* * * * *